(12) United States Patent
Seong et al.

(10) Patent No.: US 11,910,651 B2
(45) Date of Patent: Feb. 20, 2024

(54) LIGHT EMITTING DISPLAY APPARATUS INCLUDING A BANK AND A CAPACITOR

(71) Applicant: LG Display Co., Ltd., Seoul (KR)

(72) Inventors: Sejong Seong, Paju-si (KR); Seungkyeom Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 207 days.

(21) Appl. No.: 17/516,148

(22) Filed: Nov. 1, 2021

(65) Prior Publication Data

US 2022/0199730 A1 Jun. 23, 2022

(30) Foreign Application Priority Data

Dec. 21, 2020 (KR) .................... 10-2020-0179470

(51) Int. Cl.
*H01L 29/08* (2006.01)
*H10K 59/121* (2023.01)
*H10K 59/122* (2023.01)

(52) U.S. Cl.
CPC ....... *H10K 59/1216* (2023.02); *H10K 59/122* (2023.02)

(58) Field of Classification Search
CPC .................... H10K 59/1216; H10K 59/122
USPC ........................................................ 257/40
See application file for complete search history.

(56) References Cited

U.S. PATENT DOCUMENTS

| 2014/0292622 | A1* | 10/2014 | Lee ...................... H10K 59/131 345/80 |
| 2019/0206972 | A1* | 7/2019 | Park ...................... G09G 3/3291 |
| 2021/0376036 | A1* | 12/2021 | Park ...................... H10K 59/131 |

FOREIGN PATENT DOCUMENTS

| KR | 10-2018-0078813 A | 7/2018 |
| KR | 10-2019-0080346 A | 7/2019 |

* cited by examiner

*Primary Examiner* — Phuc T Dang
(74) *Attorney, Agent, or Firm* — Morgan, Lewis & Bockius LLP

(57) ABSTRACT

A disclosed light emitting display apparatus includes a substrate; a pixel driving layer on the substrate and including a driving transistor; a cover layer covering the pixel driving layer; a plurality of light emitting elements, including a first light emitting element and a second light emitting element each having a first electrode on the cover layer and being adjacent to each other; a bank disposed on the cover layer and between the first electrode of the first light emitting element and the first electrode of the second light emitting element; and a capacitor overlapping with the bank. The capacitor may include a first metal layer connected with a first terminal of the driving transistor via the first electrode of one of the first and second light emitting elements, and a second metal layer connected with a gate of the driving transistor.

19 Claims, 13 Drawing Sheets

LIGHT EMITTING DISPLAY APPARATUS INCLUDING A BANK AND A CAPACITOR

CROSS-REFERENCE TO RELATED APPLICATIONS

This application claims the benefit of and the priority to Korean Patent Application No. 10-2020-0179470 filed on Dec. 21, 2020, which is hereby incorporated by reference as if fully set forth herein.

BACKGROUND

1. Technical Field

The present disclosure relates to a light emitting display apparatus.

Discussion of the Related Art

A pixel constituting a light emitting display apparatus includes a light emitting element, and transistors and a capacitor for driving the light emitting element.

As resolution of the light emitting display apparatus is gradually increased, a size of the pixel is gradually reduced, whereby it becomes difficult to increase an aperture ratio of the pixel.

Particularly, if the capacitor is formed on the same layer as the transistors, and lines existing near the capacitor should be spaced apart from the capacitor, it becomes more difficult to increase the aperture ratio of the pixel.

SUMMARY

Accordingly, the present disclosure is directed to a light emitting display apparatus that substantially obviates one or more problems due to limitations and disadvantages of the related art.

An object of the present disclosure includes providing a light emitting display apparatus in which a capacitor is provided in an area overlapped with a bank.

In addition to the objects of the present disclosure as mentioned above, additional objects and features of the present disclosure will be clearly understood by those skilled in the art from the following description of the present disclosure.

To achieve these objects and other advantages and in accordance with the purpose of the present disclosure, as embodied and broadly described herein, a light emitting display apparatus may comprise: a substrate; a pixel driving layer on the substrate and including a driving transistor; a cover layer covering the pixel driving layer; a plurality of light emitting elements, including a first light emitting element and a second light emitting element adjacent to each other and each having a first electrode on the cover layer; a bank disposed on the cover layer and between the first electrode of the first light emitting element and the first electrode of the second light emitting element; and a capacitor overlapping with the bank, and including a first metal layer connected with a first terminal of the driving transistor via the first electrode of one of the first and second light emitting elements and a second metal layer connected with a gate of the driving transistor.

In some example embodiments, the capacitor may be disposed between the bank and the cover layer.

In some example embodiments, the capacitor may further include: a first insulating layer on the cover layer and insulating the first electrode of the first light emitting element from the first electrode of the second light emitting element, the first insulating layer being under the first metal layer; and a second insulating layer on the first metal layer and under the second metal layer, wherein the bank is disposed on the second metal layer.

In some example embodiments, the above light emitting display apparatus may further comprise: a light emitting layer on the bank and on the first electrode of at least one of the first and second light emitting elements; and a second electrode on the light emitting layer.

In some example embodiments, the bank may cover the capacitor.

In some example embodiments, the pixel driving layer may include a pixel driving unit having: the driving transistor including the gate, the first terminal connected to the first electrode of one of the first and second light emitting elements, and a second terminal connected to a first voltage supply line; a switching transistor including a gate connected to a gate line, a first terminal connected to the gate of the driving transistor, and a second terminal connected to a data line; the capacitor; and a sensing transistor including a first terminal connected to the first terminal of the driving transistor and to the first electrode of one of the first and second light emitting elements, a second terminal connected to a sensing line, and a gate connected to a sensing control line.

In some example embodiments, the capacitor may be disposed on a flat upper surface of the cover layer.

In some example embodiments, the capacitor may be disposed in a groove in the upper surface of the cover layer.

In some example embodiments, each of the first and second light emitting elements may further include: a light emitting layer on the first electrode; and a second electrode on the light emitting layer. The first electrode of each of the first and second light emitting elements may be adjacent to the groove and protrude toward a center of the groove. Also, the light emitting layer and the second electrode of the first light emitting element may respectively be separated from the light emitting layer and the second electrode of the second light emitting element at the groove.

In some example embodiments, the capacitor may extend along a boundary between the first electrode of the first light emitting element and the first electrode of the second light emitting element.

In some example embodiments, the above light emitting display apparatus may further comprise a first line between the first electrode of the first light emitting element and the first electrode of the second light emitting element in a plan view and extending in a same direction as the capacitor, wherein at least one of the first metal layer and the second metal layer of the capacitor overlaps with the first line in the plan view.

In some example embodiments, the first line may be one of a data line, a sensing line, and a first voltage supply line.

In another aspect of the present disclosure, a light emitting display apparatus may comprise: a substrate; a pixel driving layer on the substrate and including a driving transistor; a cover layer covering the pixel driving layer; a plurality of light emitting elements, including a first light emitting element and a second light emitting element each having a first electrode on the cover layer and being adjacent to each other; a bank disposed on the cover layer and between the first electrode of the first light emitting element and the first electrode of the second light emitting element; and a capacitor overlapping with the bank and extending along a boundary between the first electrode of the first light emitting element and the first electrode of the second light emitting element.

In some example embodiments, the above light emitting display apparatus may further comprise a first line between the first electrode of the first light emitting element and the first electrode of the second light emitting element in a plan view and extending in a same direction as the capacitor, wherein at least one of the first metal layer and the second metal layer of the capacitor overlaps with the first line in the plan view.

In some example embodiments, the first line may be one of a data line, a sensing line, and a first voltage supply line.

In some example embodiments, the capacitor may includes: a first insulating layer on the substrate; a first metal layer on the first insulating layer; a second insulating layer on the first metal layer; and a second metal layer of the second insulating layer, wherein the cover layer is disposed the second metal layer.

In some example embodiments, the capacitor may be disposed in the pixel driving layer. The first metal layer may be connected with a first terminal of the driving transistor via the first electrode of one of the first and second light emitting elements. The second metal layer may be connected with a gate of the driving transistor.

In some example embodiments, the capacitor may be disposed between the bank and the cover layer.

In some example embodiments, the capacitor may be disposed in a groove in the upper surface of the cover layer.

In some example embodiments, each of the first and second light emitting elements may further include: a light emitting layer on the first electrode; and a second electrode on the light emitting layer. The first electrode of each of the first and second light emitting elements may be adjacent to the groove and protrude toward a center of the groove. The light emitting layer and the second electrode of the first light emitting element may respectively be separated from the light emitting layer and the second electrode of the second light emitting element at the groove.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiment(s) of the disclosure and together with the description serve to explain the principles of the disclosure. In the drawings.

DETAILED DESCRIPTION

Figure 1:
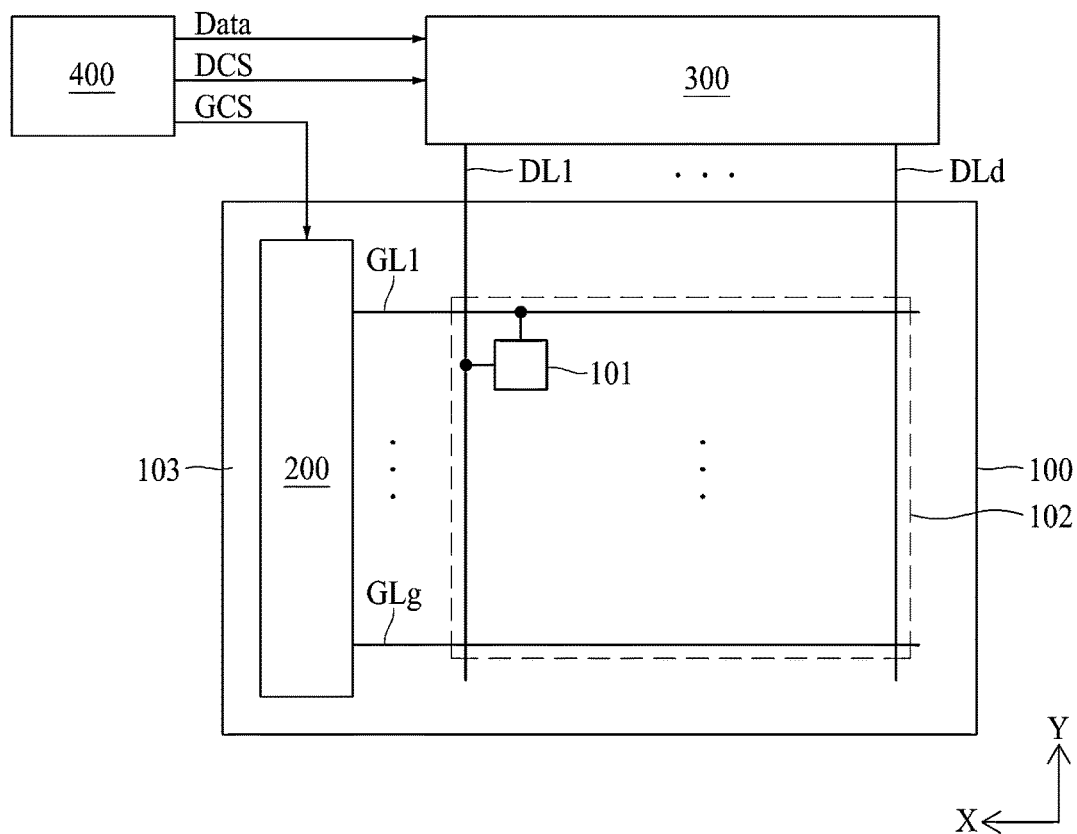
FIG. 1 is an exemplary view illustrating a structure of a light emitting display apparatus according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

In the drawings, the same or similar elements are denoted by the same reference numerals even though they are depicted in different drawings. Wherever possible, the same reference numbers will be used throughout the drawings to refer to the same or like parts.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, the embodiment of the present disclosure will be described in detail with reference to the accompanying drawings.

Figure 2:
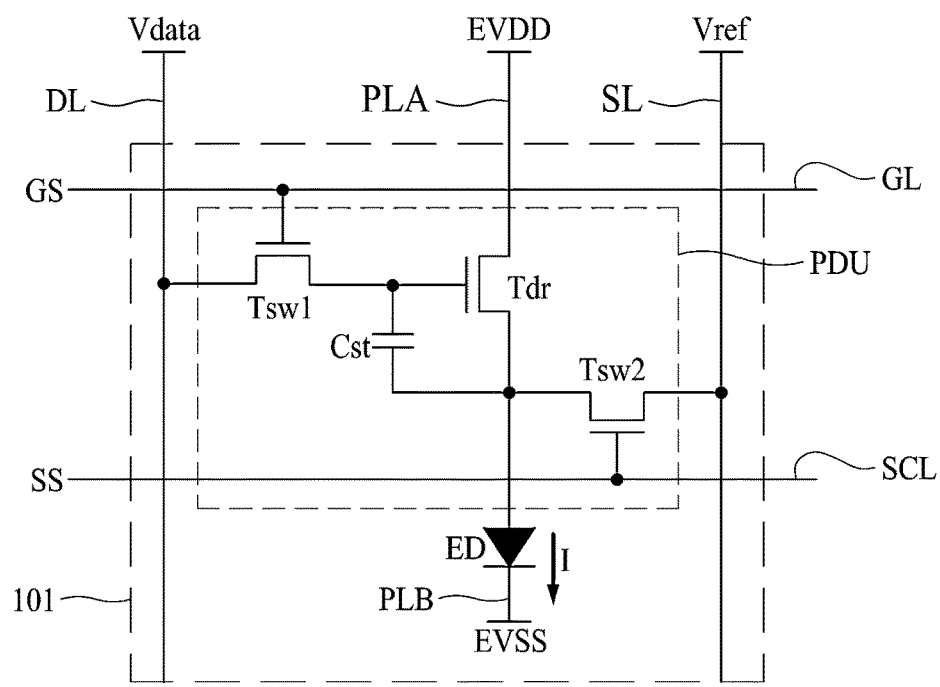
FIG. 2 is an exemplary view illustrating a structure of a pixel applied to a light emitting display apparatus according to an example embodiment of the present disclosure.
Figure 3:
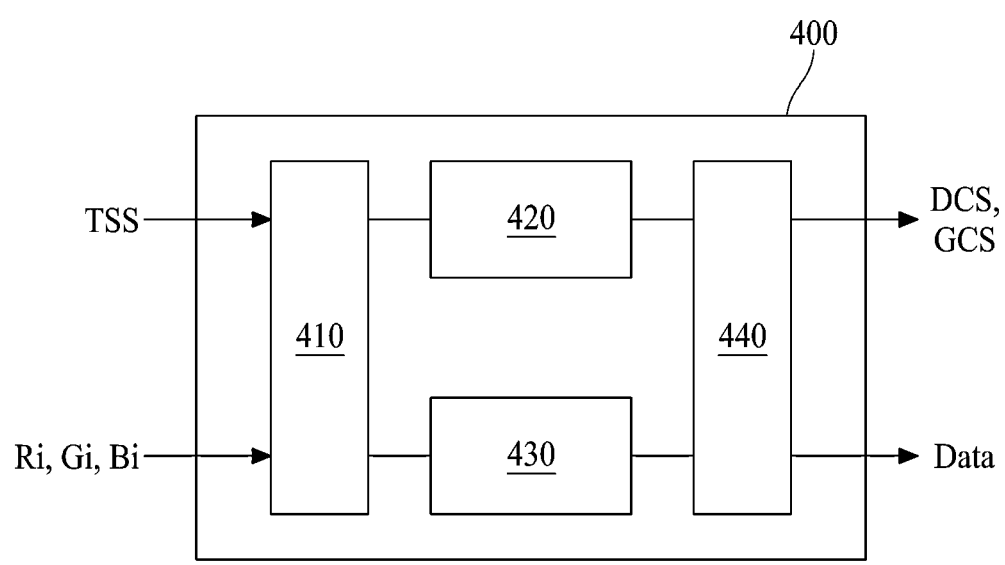
FIG. 3 is an exemplary view illustrating a structure of a controller applied to a light emitting display apparatus according to an example embodiment of the present disclosure.

FIG. 1 is an exemplary view illustrating a structure of a light emitting display apparatus according to an example embodiment of the present disclosure. FIG. 2 is an exemplary view illustrating a structure of a pixel applied to a light emitting display apparatus according to an example embodiment of the present disclosure. FIG. 3 is an exemplary view illustrating a structure of a controller applied to a light emitting display apparatus according to an example embodiment of the present disclosure.

The light emitting display apparatus according to an example embodiment the present disclosure may constitute any of various electronic devices. For example, the electronic device may be a smartphone, a tablet PC, a television, a monitor, or the like.

As shown in FIG. 1, the light emitting display apparatus according to an example embodiment of the present disclosure may include a light emitting display panel 100 provided with pixels 101 to display an image, a data driver 300 for supplying data voltages Vdata to data lines DL1 to DLd provided in the light emitting display panel 100, a gate driver 200 for supplying gate voltages to gate lines GL1 to GLg provided in the light emitting display panel 100, and a controller 400 for controlling the data driver 300 and the gate driver 200.

First, the light emitting display panel 100 may include a display area 102 and a non-display area 103. The display area 102 may be provided with gate lines GL1 to GLg, data lines DL1 to DLd, and pixels 101.

The display area 102 may output or display an image. The non-display area 103 may surround the display area 102 and does not output an image.

As shown in FIG. 2, an example pixel 101 provided in the light emitting display panel 100 may include a light emitting element ED, a switching transistor Tsw1, a capacitor Cst, a driving transistor Tdr, and a sensing transistor Tsw2. That is, the pixel 101 may include a pixel driving unit PDU and a light emitting unit, wherein the pixel driving unit PDU may include a switching transistor Tsw1, a capacitor Cst, a driving transistor Tdr, and a sensing transistor Tsw2, and the light emitting unit may include a light emitting element ED.

For example, the light emitting element ED may include a first electrode in each of the pixels 101 provided on a substrate of the light emitting display panel 100, a light emitting layer on the first electrode, and a second electrode covering the light emitting layer. The first electrode may be an electrode connected with the driving transistor Tdr in FIG. 2. The second electrode may be an electrode connected with a second voltage supply line PLB. The light emitting layer may be provided between the first electrode and the second electrode.

The first electrode may serve as an anode of the light emitting element ED, and the second electrode may serve as a cathode. That is, the light emitting layer may output light based on an anode voltage supplied to an anode and a cathode voltage supplied to a cathode.

The light emitting layer may include any of an organic light emitting layer, an inorganic light emitting layer, and a quantum dot light emitting layer, or may include a deposited or mixed structure of an organic light emitting layer (or inorganic light emitting layer) and a quantum dot light emitting layer.

The switching transistor Tsw1 of the pixel driving unit PDU may be turned on or off by a gate signal GS supplied to the gate line GL. The data voltage Vdata supplied through the data line DL may be supplied to a gate of the driving transistor Tdr when the switching transistor Tsw1 is turned on.

A first voltage EVDD may be supplied to the driving transistor Tdr and the light emitting element ED through a first voltage supply line PLA. A second voltage EVSS may be supplied to the light emitting element ED through the second voltage supply line PLB.

The driving transistor Tdr may control a magnitude of current I supplied to the light emitting element ED in accordance with the data voltage supplied to the gate. Therefore, brightness of the light output from the light emitting element ED may be controlled.

The sensing transistor Tsw2 may be turned on or off by a sensing control signal SS supplied through a sensing control line SCL, and a sensing line SL may be connected to the sensing transistor Tsw2.

A reference voltage Vref may be supplied to the pixel 101 through the sensing line SL, and a sensing signal related to a characteristic change of the driving transistor Tdr may be transmitted to the sensing line SL through the sensing transistor Tsw2.

The light emitting display panel 100 according to an example embodiment of the present disclosure may be formed in the structure shown in FIG. 2, but the present disclosure is not limited thereto. Therefore, the light emitting display panel 100 employed in the present disclosure may have any of various alternative configurations instead of the structure shown in FIG. 2.

An example structure of the light emitting display panel 100 according to an example embodiment of the present disclosure will be described in detail with reference to FIGS. 4 to 20.

Next, the controller 400, as shown in FIG. 3, may include a data aligner 430 for realigning input image data Ri, Gi, and Bi transmitted from an external system using a timing synchronization signal TSS transmitted from the external system and for supplying the realigned image data Data to the data driver 300. The controller 400 may also include a control signal generator 420 for generating a gate control signal GCS and a data control signal DCS using the timing synchronization signal TSS. In addition, the controller 400 may include an input unit 410 for receiving the timing synchronization signal TSS and the input image data Ri, Gi, and Bi transmitted from the external system and for transmitting them to the data aligner 430 and the control signal generator 420. The controller 400 may also include an output unit 440 for outputting the image data Data generated from the data aligner 430 and the control signals DCS and GCS generated from the control signal generator 420 to the data driver 300 or the gate driver 200.

The external system (not illustrated) may serve to drive the controller 400 and the electronic device. For example, if the electronic device is a smart phone, the external system may receive various kinds of voice information, image information, and text information through a wireless communication network and transmit the received image information to the controller 400. The image information may be the input image data Ri, Gi and Bi.

The data driver 300 may be provided in one or more chip-on films attached to the light emitting display panel 100 and may also be connected to a main substrate provided with the controller 400. In this case, lines for electrically connecting the controller 400, the data driver 300, and the light emitting display panel 100 may be provided in the chip-on-film(s). To this end, the lines may be electrically connected to pads provided in the main substrate and the light emitting display panel 100. The main substrate may be electrically connected with an external substrate on which the external system is mounted.

Alternatively, the data driver 300 may be directly mounted on the light emitting display panel 100 and then be electrically connected with the main substrate of the controller 400.

As another alternative, the data driver 300 may be formed as one integrated circuit together with the controller 400, wherein the integrated circuit may be provided in the chip-on film(s) or be directly mounted on the light emitting display panel 100.

The data driver 300 may convert the image data Data input from the controller 400 into the data voltages Vdata and supply the data voltages Vdata of one horizontal line to the data lines DL1 to DLd for each horizontal period in which a gate pulse is supplied to the gate line GL. For example, the data driver 300 may convert the image data Data into the data voltages Vdata based on gamma voltages supplied from a gamma voltage generator and may output the data voltages Vdata to the data lines DL1 to DLd for an image output period.

In this case, a horizontal line refers to a virtual line formed along a gate line GL. In the horizontal line, pixels connected with the gate line GL are disposed in a row. That is, the horizontal line refers to a virtual line corresponding to the gate line GL.

Finally, the gate driver 200 may be provided as an integrated circuit mounted on the non-display area 103. Alternatively, the gate driver 200 may directly be embedded in the non-display area 103 of the light emitting display panel 100 using a gate-in-panel (GIP) scheme. If the gate-in-panel scheme is used, the transistors constituting the gate driver 200 may be provided in the non-display area 103 through the same process as that of the transistors provided in the respective pixels 101 of the display area 102.

When the gate pulse generated by the gate driver 200 is supplied to a gate of the switching transistor Tsw1 provided in the pixel 101, the switching transistor Tsw1 may be turned on. When a gate-off signal is supplied to the switching transistor Tsw1, the switching transistor Tsw1 may be turned off. The gate signal GS supplied to the gate line GL may include a gate pulse and a gate-off signal.

Figure 4:
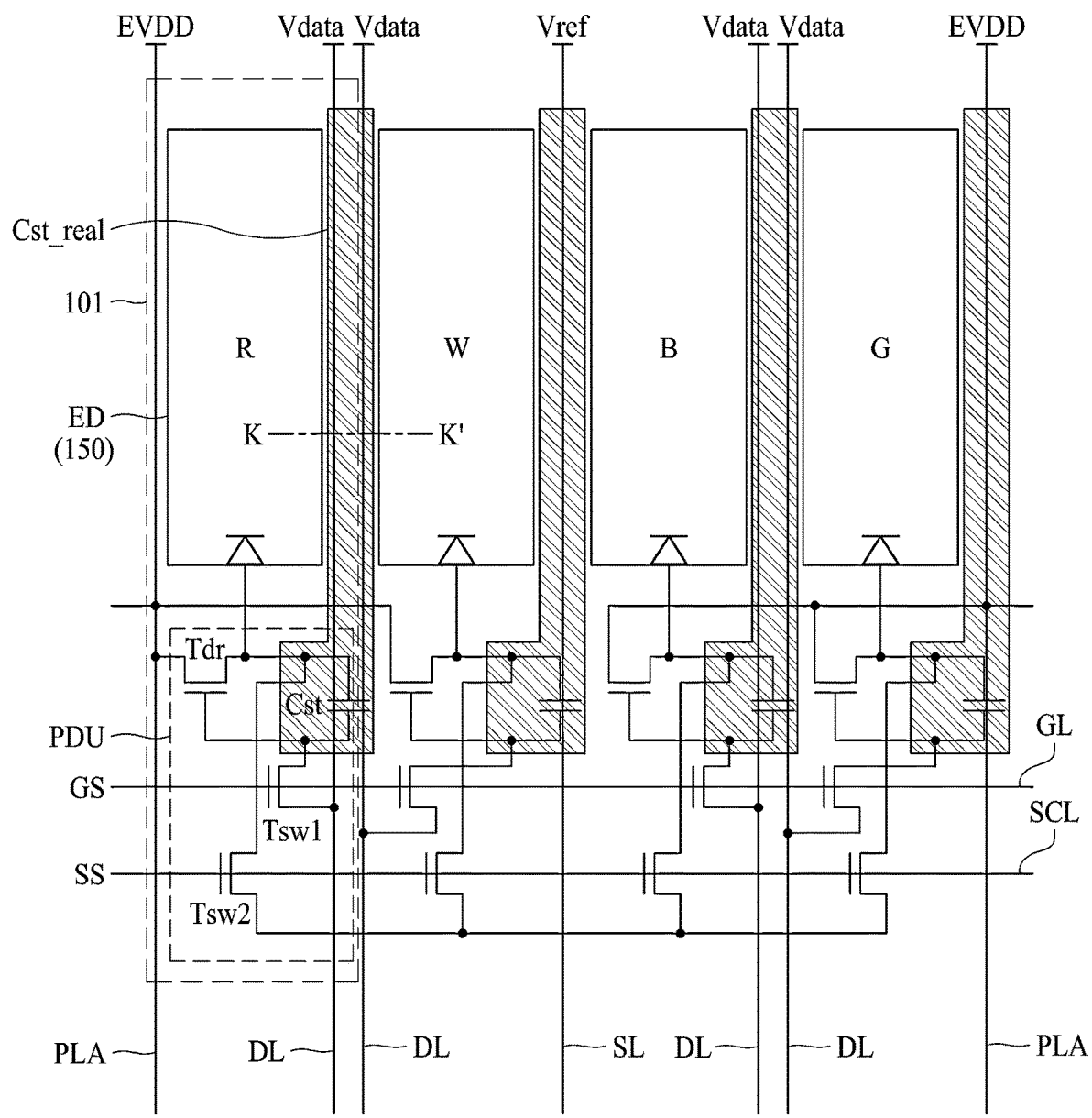
FIG. 4 is an exemplary view illustrating a structure of four pixels applied to a light emitting display apparatus according to an example embodiment of the present disclosure.
Figure 5:
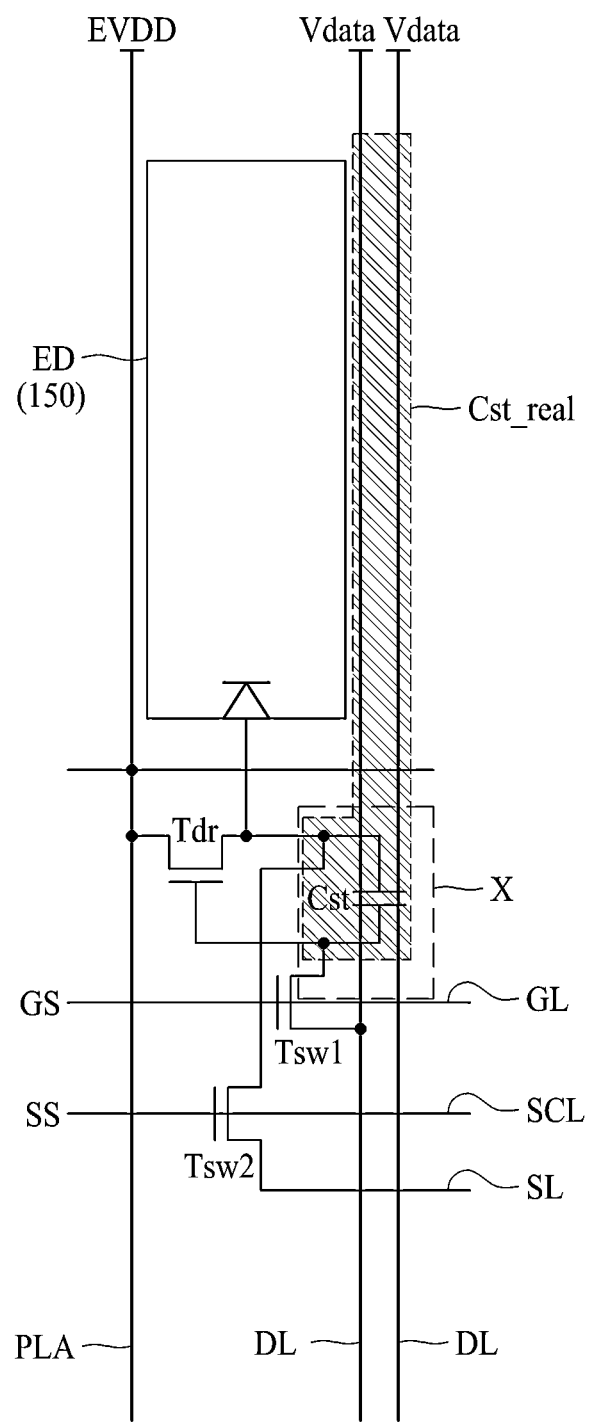
FIG. 5 is an exemplary view illustrating a structure of any one of the example pixels shown in FIG. 4.

FIG. 4 is an exemplary view illustrating a structure of four pixels applied to a light emitting display apparatus according to an example embodiment of the present disclosure. FIG. 5 is an exemplary view illustrating a structure of any one of the example pixels shown in FIG. 4. In FIGS. 4 and 5, the example pixel(s) may be illustrated partly in an actual structural layout format and partly in an electrical circuit diagram format. That is, in FIGS. 4 and 5, a first electrode (or an anode), a data line DL, a sensing line SL, a first voltage supply line PLA, and a capacitor Cst real of the light emitting element ED may be shown in an actual structural layout format while each of the elements constituting the pixel driving unit PDU may be shown in an electrical circuit diagram format.

The light emitting display apparatus according to an example embodiment of the present disclosure may include a light emitting display panel 100, a data driver 300, a gate driver 200, and a controller 400. The light emitting display panel 100 may include a plurality of pixels 101. Four pixels 101 constituting an example unit pixel among a plurality of pixels 101 are shown in FIG. 4.

The unit pixel is a reference unit for representing various colors, and may, for example, include a red pixel R, a white pixel W, a blue pixel R and a green pixel G as shown in FIG. 4. However, the present disclosure is not limited thereto. That is, the unit pixel may be formed of pixels representing various colors in addition to the pixels of the type described above and may be formed of three pixels.

As described with reference to FIG. 2, each of the pixels incorporated in an example embodiment of the present disclosure includes a light emitting element ED and a pixel driving unit PDU, wherein the pixel driving unit PDU may include various structures in addition to the structure shown in FIG. 2. Hereinafter, for convenience of description, the present disclosure will be described using the example pixel 101 that includes the example pixel driving unit PDU as shown in FIG. 2.

That is, as shown in FIGS. 4 and 5, the pixel 101 according to an example embodiment of the present disclosure may include a pixel driving unit PDU having a driving transistor Tdr, a switching transistor Tsw1, a capacitor Cst, and a sensing transistor Tsw2 and include a light emitting element ED connected with the driving transistor Tdr.

The light emitting element ED may include an anode, a light emitting layer, and a second electrode (or a cathode). The example light emitting element ED shown in FIGS. 4 and 5 may substantially be an anode. That is, as shown in FIGS. 2, 4 and 5, the anode may be connected with the driving transistor Tdr.

The switching transistor Tsw1 may be turned on or off by the gate signal GS supplied through the gate line GL. The sensing transistor Tsw2 may be turned on or off by the sensing control signal SS supplied through the sensing control line SCL. The driving transistor Tdr may be turned on or off in accordance with the data voltage Vdata supplied through the switching transistor Tdr to control the amount of a current generated via the first voltage EVDD.

In this case, at least one line may be provided between two pixels 101 adjacent to each other. For example, in the example light emitting display panel 100 shown in FIGS. 4 and 5, one or more of the first voltage supply line PLA, the data line DL, and the sensing line SL may be provided between the two adjacent pixels 101.

For example, a first voltage supply line PLA may be provided between a red pixel R, which is the leftmost pixel among the four pixels constituting the example unit pixel, and an adjacent pixel on the left of the red pixel R. Two data lines DL may be provided between the red pixel R and a white pixel W. A sensing line SL may be provided between the white pixel W and a blue pixel B. Two data lines DL may be provided between the blue pixel B and a green pixel G. A first voltage supply line PLA may be provided between a green pixel G, which is the rightmost pixel among the four pixels constituting the example unit pixel, and an adjacent pixel on the right of the green pixel G.

The sensing line SL may be commonly connected to the four pixels constituting an example unit pixel. The two data lines DL provided between the two adjacent pixels 101 may be connected to the two adjacent pixels 101, respectively.

Two anodes provided in two pixels 101 adjacent to each other with a data line DL, a sensing line SL, or a first voltage supply line PLA, which may simply be referred to as a first line, interposed therebetween may be spaced apart from each other as shown in FIG. 4.

In an example embodiment of the present disclosure, a capacitor Cst of the pixel driving unit PDU may be provided between the two pixels 101 adjacent to each other with the first line (a data line DL, a sensing line SL, or a first voltage line PLA) interposed therebetween, particularly between the two corresponding adjacent anodes. In FIGS. 4 and 5, the reference numeral Cst denotes an example capacitor represented by an electric circuit diagram, and the reference numeral Cst real denotes an example of an actual capacitor layout provided in the light emitting display panel 100.

In FIG. 4 and FIG. 5, the capacitor Cst of the pixel driving unit PDU (represented by an electric circuit diagram) may be substantially provided in an area indicated by the reference numeral Cst real. In addition, in FIGS. 4 and 5, the reference numerals Cst and Cst real represent the same capacitor. Particularly, Cst denotes an example capacitor as provided in the representative electric circuit diagram, and Cst real denotes an example of an actual capacitor illustrated in a plan view layout provided in the light emitting display panel. Hereinafter, for convenience of description, both the capacitor provided in the representative electrical circuit diagram and the actual capacitor illustrated in a plan view layout are indicated by the reference numeral Cst.

The capacitor Cst may be provided between two adjacent anodes and, in particular, is provided along a first line (a data line DL, a sensing line SL, or a first voltage line PLA) between the two adjacent anodes. In other words, the capacitor Cst may be formed to extend along a boundary between two adjacent anodes. Therefore, the capacitor Cst may be provided in a sufficiently wide area and therefore may have a sufficient capacitance for an example embodiment of the present disclosure. That is, the capacitance is a physical quantity representing the capability of the capacitor Cst to store charges therein, and the capacitance is proportional to the overlapping area of two electrodes (also referred to as a first metal layer and a second metal layer) constituting the capacitor.

In a first direction of the light emitting display panel 100, for example, between two anodes adjacent to each other with a first line provided along a vertical direction as a boundary, additional electrodes affecting electrical characteristics of the capacitor are not provided, and a sufficiently large area to form a sufficient capacitance for an example embodiment of the present disclosure may be provided. Therefore, according to an example embodiment of the present disclosure, a capacitor Cst having better performance than that of the prior art may be provided.

That is, in the related art, in the example pixel 101 shown in FIGS. 4 and 5, a capacitor is provided in an area in which a driving transistor Tdr, a switching transistor Tsw1 and a sensing transistor Tsw2 are provided. In this case, to insulate metal electrodes constituting transistors adjacent to the capacitor from a first metal layer and a second metal layer of the capacitor and to prevent or minimize parasitic capacitance between the metal electrodes and the first and second metal layers, the metal electrodes and the capacitor should be spaced apart from each other by a minimum distance. In addition, the driving transistor Tdr, the switching transistor Tsw1, the sensing transistor Tsw2, and the capacitor should be formed in a limited area. Therefore, a size of the capacitor may be limited, and a sufficient capacitance may not be provided for a light emitting display apparatus.

However, in an example embodiment of the present disclosure as described above, since a capacitor Cst may be provided between two anodes adjacent to each other with the first line as a boundary, parasitic capacitance generated between the capacitor Cst and the other electrodes may be reduced. In addition, in the example embodiment of the present disclosure, since a capacitor Cst having a size corresponding to an area between two anodes may be provided, a sufficient capacitance may be ensured for the example light emitting display apparatus. Therefore, according to an example embodiment of the present disclosure, a capacitor Cst having better performance than that of the related art may be provided.

Figure 6:
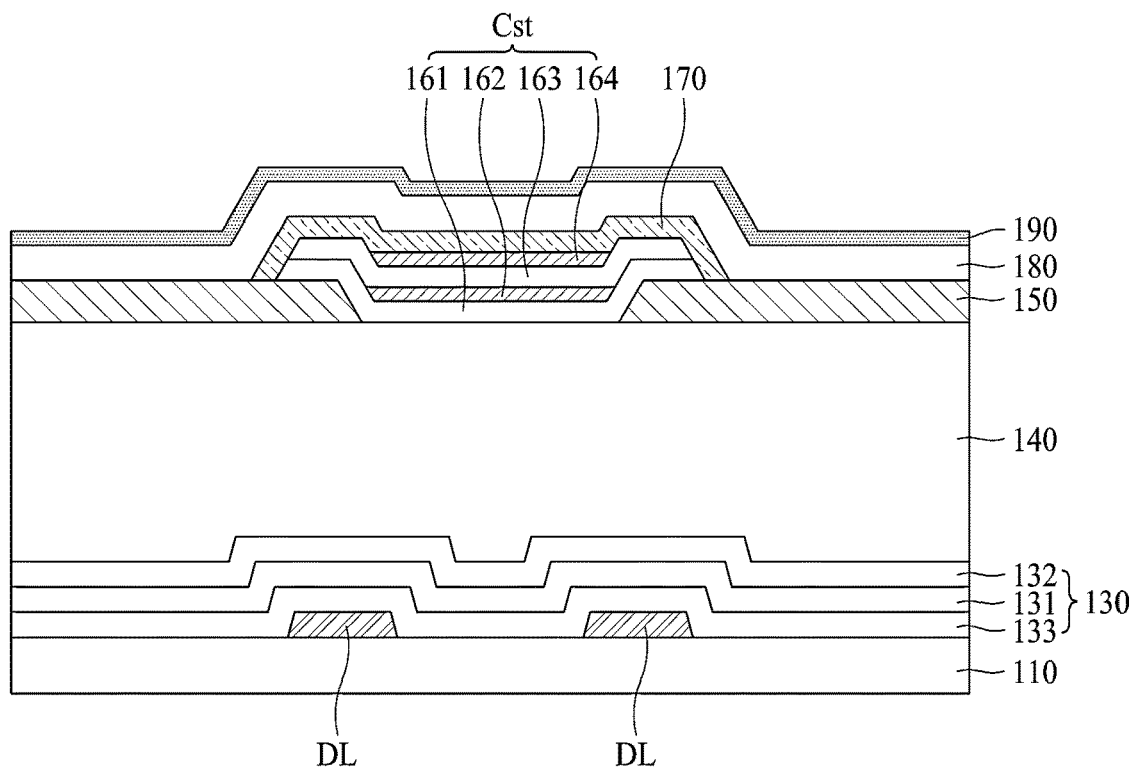
FIG. 6 is an exemplary view illustrating a cross-section taken along line K-K' shown in FIG. 4.
Figure 7:
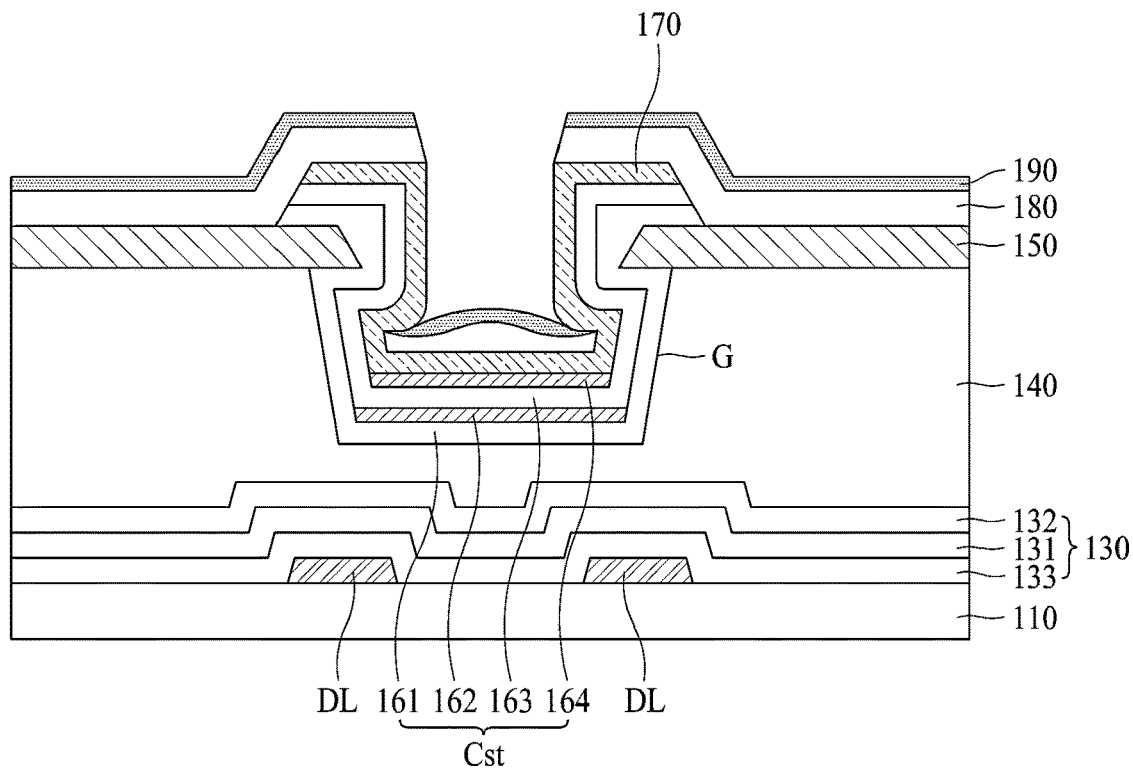
FIG. 7 is another exemplary view illustrating a cross-section taken along line K-K' shown in FIG. 4.
Figure 8:
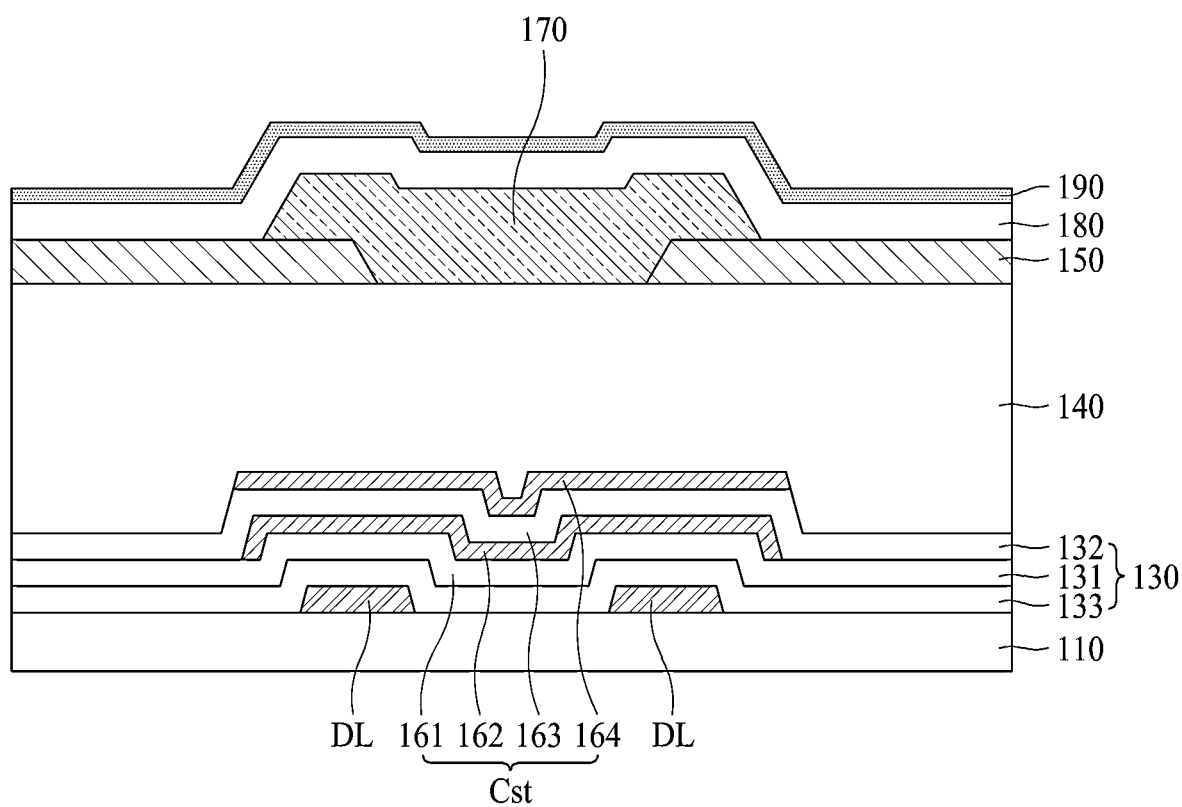
FIG. 8 is yet another exemplary view illustrating a cross-section taken along line K-K' shown in FIG. 4.

FIG. 6 is an exemplary view illustrating a cross-section taken along line K-K' shown in FIG. 4. FIG. 7 is another exemplary view illustrating a cross-section taken along line K-K' shown in FIG. 4. FIG. 8 is yet another exemplary view illustrating a cross-section taken along line K-K' shown in FIG. 4.

The light emitting display apparatus according to an example embodiment of the present disclosure may include a light emitting display panel 100, a data driver 300, a gate driver 200, and a controller 400. As shown in FIGS. 6 to 8, the light emitting display panel 100 may include a substrate 110, a pixel driving layer 130 provided on the substrate 110, a cover layer 140 covering the pixel driving layer 130. The light emitting display panel 100 may also include a bank 170 provided on the cover layer 140 and between two first electrodes (anodes) 150 of two light emitting elements adjacent to each other, and include a capacitor Cst provided to overlap with the bank 170. In this case, the first metal layer 162 of the capacitor Cst may be connected to a first terminal of the driving transistor Tdr provided in the pixel driving layer 130 and the first electrode 150 provided on the cover layer 140. In more detail, the first metal layer 162 of the capacitor Cst may be connected to the first terminal of the driving transistor Tdr provided in the pixel driving layer 130 via the first electrode 150 provided on the cover layer 130. The second metal layer 164 may be connected to the gate of the driving transistor Tdr and a first terminal of the switching transistor Tsw1. In this case, the first electrode 150 may be an anode among the anode, a light emitting layer, and a cathode which together constitute the light emitting element. Hereinafter, the cathode may be referred to as a second electrode 190. The pixel driving layer 130 may be provided with the pixel driving unit PDU described above.

The substrate 110 may be a glass substrate or a plastic substrate, or may alternatively be formed of one or more of various kinds of films. A first line (e.g., DL, SL, or PLA) may be provided on the substrate 110. In the examples shown in FIGS. 6 to 8, two data lines DL may be provided on the substrate 110 in the cross-section cut along line K-K' shown in FIG. 4. In addition to the data lines DL, various other lines (e.g., SL or PLA) that may be referred to as the first line may be provided on the substrate 110. Also, a light shielding layer used for shielding light flowing to the transistors may be provided on the substrate 110.

A pixel driving layer 130 including a pixel driving unit PDU described with reference to FIG. 2 may be provided on the substrate 110. The pixel driving unit PDU may include a switching transistor Tsw1, a capacitor Cst, a driving transistor Tdr, and a sensing transistor Tsw2. In this case, as shown in FIG. 8, the capacitor Cst may be provided in the pixel driving layer 130. However, the capacitor Cst may be provided in a layer different from the pixel driving layer 130, as shown in FIGS. 6 and 7. The capacitor Cst will be described below separately from the pixel driving unit PDU.

The pixel driving layer 130 may include various types of lines, such as a data line DL, a gate line GL, a first voltage supply line PLA, a second voltage supply line PLB, a sensing line SL, and a sensing control line SCL. Each of the lines may be formed of one metal, such as copper (Cu), or may be provided in a stacked form in which at least two metals are deposited.

In addition, the pixel driving layer 130 may include at least one insulating layer provided to insulate the transistors from the lines. Each of the insulating layers may be formed of at least one inorganic layer or at least one organic layer, or may be formed of at least one inorganic layer and at least one organic layer. A gate insulating layer 131 and a passivation layer 132 among various insulating layers that may be included the pixel driving layer 130 are shown in FIGS. 6 to 8. The gate insulating layer 131 may serve to insulate the semiconductor layer and the gate of the transistor provided in the pixel driving layer 130 from each other. The passivation layer 132 may serve to cover the transistors provided in the pixel driving layer 130.

In addition, a buffer 133 may be included in the pixel driving layer 130. The buffer 133 may be provided between the substrate 110 and the gate insulating layer 131. The buffer 133 may be formed of at least one inorganic layer or at least one organic layer, or may be formed of at least one inorganic layer and at least one organic layer. Two data lines DL may be covered by the buffer.

A cover layer 140 may be provided on the pixel driving layer 130. The cover layer 140 may serve to planarize surfaces made uneven by the transistors and lines provided in the pixel driving layer 130. That is, the upper surface of the pixel driving layer 130 may be uneven due to the transistors and lines provided in the pixel driving layer 130. In this case, as the cover layer 140 thicker than the pixel driving layer 130 may cover the pixel driving layer 130, the upper surface of the cover layer 140 may be planarized. The cover layer 140 may be formed of at least one inorganic layer or at least one organic layer, or may be formed of at least one inorganic layer and at least one organic layer. If a color filter is provided in the light emitting display panel 100 according to an example embodiment of the present disclosure, the color filter may be provided as part of the cover layer 140 or on the cover layer 140. If the color filter is provided as part of the cover layer 140, the cover layer 140 may include a planarization layer provided on the pixel driving layer 130 and an overcoating layer provided on the planarization layer, and the color filter may be provided between the planarization layer and the overcoating layer. That is, the cover layer 140 may include one or more layers.

The first electrode 150 may be provided on the upper surface of the cover layer 140 having a flat surface. The first electrode 150 may be formed of a transparent electrode or an opaque electrode, or may include at least one transparent electrode and at least one opaque electrode. The first electrode 150 may be connected with the driving transistor Tdr.

The bank 170 may be provided on the cover layer 140 and may be provided between two first electrodes 150 respectively of two light emitting elements adjacent to each other. That is, the bank 170 may be provided adjacent to the first electrodes 150. The pixels 101 may be divided or separated from each other by the bank 170. The bank 170 may be formed of at least one inorganic layer or at least one organic layer, or may be formed of at least one inorganic layer and at least one organic layer.

The light emitting layer 180 may cover the first electrode 150 and the bank 170. The light emitting layer 180 may include any one of an organic light emitting layer, an inorganic light emitting layer and a quantum dot light emitting layer, or may include a deposited or mixed structure of an organic light emitting layer (or inorganic light emitting layer) and a quantum dot light emitting layer. As shown in FIGS. 4 and 6, the light emitting layer 180 provided in any one pixel 101 may be connected with the light emitting layer 180 provided in another adjacent pixel 101. That is, the light emitting layer 180 may be provided on the entire surface of the substrate 110 in the form of a single plate. However, the light emitting layer 180 in one pixel 101 may be spaced apart from the light emitting layer 180 provided in an adjacent pixel 101. That is, a separate light emitting layer 180 and a separate first electrode 150 may be provided for each pixel 101 so that a light emitting layer 180 and a first electrode 150 in one pixel 101 may respectively be separated from a light emitting layer 180 and a first electrode in an adjacent pixel 101.

The cathode of the light emitting element ED, or the second electrode 190, may cover the light emitting layer 180. The second electrode 190 may be formed of a transparent electrode or an opaque electrode, or may include at least one transparent electrode and at least one opaque electrode. As shown in FIG. 6, the second electrode 190 may be provided on the entire display area in the form of a plate.

An encapsulation layer (not illustrated) may be provided on the second electrode 190. The encapsulation layer may be formed of at least one inorganic layer or at least one organic layer, or may be formed of at least one inorganic layer and at least one organic layer. The color filter may be provided on or under the encapsulation layer, or may be provided in the encapsulation layer. The encapsulation layer may be covered by a cover glass.

The capacitor Cst may be provided at a position overlapping with the bank 170. Since the capacitor Cst is disposed at the position overlapping with the bank 170, as described above, parasitic capacitance generated between the capacitor Cst and other electrodes may be reduced. Also, a size and capacitance of the capacitor Cst may freely be varied.

Various modifications may be made in the detailed position and shape of the capacitor Cst. For example, as shown in FIGS. 6 and 7, the capacitor Cst may be provided between the bank 170 and the cover layer 140.

In this case, the capacitor Cst may include a first insulating layer 161 provided on the cover layer 140, insulating two first electrodes 150 provided in two adjacent pixels 101 from each other. The capacitor Cst may also include a first metal layer 162 provided on the first insulating layer 161 and connected to the first terminal of the driving transistor Tdr and any one of the two first electrodes 150. The capacitor may additionally include a second insulating layer 163 provided on the first metal layer 162 and a second metal layer 164 disposed on the second insulating layer 163. The second metal layer may be connected to the gate of the driving transistor Tdr and the first terminal of the switching transistor Tsw1. A bank 170 may be provided on the second metal layer 164.

Each of the first insulating layer 161 and the second insulating layer 163 may be formed of one inorganic layer or at least one organic layer, or may be formed of at least one inorganic layer and at least one organic layer.

The first metal layer 162 and the second metal layer 163 may be formed of a metal, such as copper (Cu), or various kinds of alloys.

Since the capacitor Cst is covered by the bank 170 in this example configuration, a width of the bank 170 may be greater than that of the capacitor Cst.

In particular, in the example light emitting display panel 100 shown in FIG. 6, the capacitor Cst may be provided on a flat upper surface of the cover layer 140. That is, the first electrodes 150 may be provided on the upper surface of the cover layer 140, and the capacitor Cst may be provided between the first electrodes 150. Therefore, the capacitor Cst may be provided on the upper surface of the cover layer 140, which is exposed between the first electrodes 150.

As another example, in the example light emitting display panel 100 shown in FIG. 7, the capacitor Cst may be provided in a groove G formed on the upper surface of the cover layer 140. The groove G may have a shape that is recessed from the upper surface of the cover layer 140 toward the inner portion of the cover layer 140.

In addition, as shown in FIG. 7, since each of the first electrodes 150 adjacent to the periphery of the groove G may protrude toward the groove G, the light emitting layer 180 and the second electrode 190 provided on the first electrodes 150 may be separated from the groove G.

As illustrated in FIG. 7, since each of the two first electrodes 150 adjacent to the groove G may protrude in the direction toward the groove G, an undercut may be formed in the groove G below the two first electrodes 150. In this case, if the capacitor Cst and the bank 170 are formed in the groove G, a step difference may be generated outside and inside the groove G by the capacitor Cst and the bank 170. Therefore, a step difference may be generated between the light emitting layer 180 provided outside the groove G and the light emitting layer 180 provided inside the groove. Thus, the light emitting layer 180 provided outside the groove G and the light emitting layer 180 provided inside the groove G may be separated from each other. The second electrode 190 provided on the light emitting layer 180 may also be similarly provided inside and outside the groove G so that the second electrode 190 outside the groove G and the second electrode 180 inside the groove G separated from each other.

Since the light emitting layer 180 in one pixel 101 may be separated from the light emitting layer in an adjacent pixel 101, as shown in FIG. 7, a leakage current may not be generated between the two adjacent pixels 101. Thus, leakage light may not be generated between the two adjacent pixels 101. The leakage current blocking effect and the leakage light blocking effect may be further improved as the second electrodes 190, in addition to the light emitting layers 180, of the two adjacent pixels 101 are separated from each other. In this case, the light emitting layer 180 inside the groove G and the light emitting layer outside the groove G may completely be separated from each other. However, in another side of the groove G that is not shown in FIG. 7 among various sides of the groove G, the light emitting layer 180 inside the groove G and the light emitting layer outside the groove G may be connected with each other. That is, as shown in FIG. 7, only in a side of the groove G disposed along the first line among various sides of the groove G, the light emitting layer 180 inside the groove G and the light emitting layer outside the groove G may be separated from each other. In the other sides of the groove G, the light emitting layer 180 inside the groove G and the light emitting layer outside the groove G may be connected with each other. The second electrode 190 may also be provided inside and outside the groove G similarly to the light emitting layer 180.

As still another example, in the example light emitting display panel 100 shown in FIG. 8, the capacitor Cst may be provided in the pixel driving layer 130 to overlap with the bank 170.

In this case, the capacitor Cst may include a first insulating layer 161 provided on an upper surface of the buffer 133, a first metal layer 162 provided on an upper surface of the first insulating layer 161, a second insulating layer 163 provided on an upper surface of the first metal layer 162, and a second metal layer 164 provided on an upper surface of the second insulating layer 163. The cover layer 140 may be provided on an upper surface of the second metal layer 164.

The first insulating layer 162 may be a gate insulating layer 131 of the pixel driving layer 130, and the second insulating layer 164 may be a passivation layer 132 of the pixel driving layer 130. The gate insulating layer 131 may serve to insulate the semiconductor layer and the gate of the transistor (e.g., the driving transistor, the switching transistor, or the sensing transistor) provided in the pixel driving layer 130 from each other. The passivation layer 132 may serve to cover the transistors provided in the pixel driving layer 130.

That is, the capacitor Cst may be disposed in an area of the pixel driving layer 130, which overlaps with the bank 170. In this case, since the transistors and the capacitor Cst provided in the pixel driving layer 130 may be spaced apart from each other, parasitic capacitance generated between the capacitor Cst and the other electrodes may be reduced. Also, the size and capacitance of the capacitor Cst may freely be varied depending on a length and a width of the bank 170.

As described above, the capacitor Cst may be provided in the pixel driving unit PDU, and the pixel driving unit PDU may be provided in the pixel driving layer 130.

That is, the pixel driving unit PDU provided in the pixel driving layer 130 may include (1) a driving transistor Tdr including a gate, a first terminal connected with the first electrode 150, and a second terminal connected with the first voltage supply line PLA, (2) a switching transistor Tsw1 including a gate connected with the gate line GL, a first terminal connected with the gate of the driving transistor Tdr, and a second terminal connected with the data line DL, (3) a capacitor Cst including a first metal layer 162 connected with the first terminal of the driving transistor Tdr and the first electrode 150 and including a second metal layer 164 connected with the gate of the driving transistor Tdr and the first terminal of the switching transistor Tdr, and (4) a sensing transistor Tsw2 including a first terminal connected to the first terminal of the driving transistor Tsw1 and the first electrode 150, a second terminal connected to the sensing line SL, and a gate connected to the sensing control line SCL.

That is, the first metal layer 162 of the capacitor Cst may be connected to the first terminal of the driving transistor Tdr and the first electrode, and the second metal layer 164 of the capacitor Cst may be connected to the gate of the driving transistor Tdr and the first terminal of the switching transistor Tsw1.

Hereinafter, an example structure in which the first metal layer 162 is connected to the first terminal of the driving transistor Tdr and the first electrode 150 and an example structure in which the second metal layer 164 is connected with the gate of the driving transistor Tdr and the first terminal of the switching transistor Tsw1 will be described with reference to FIGS. 9 to 20. In particular, in FIGS. 9 to 20, an example embodiment of the present disclosure will be described with reference to the light emitting display panel having the example structure shown in FIGS. 6 and 7. In the following description, the same or similar description already provided above with reference to FIGS. 1 to 7 may be omitted or may be briefly described.

Figure 16:
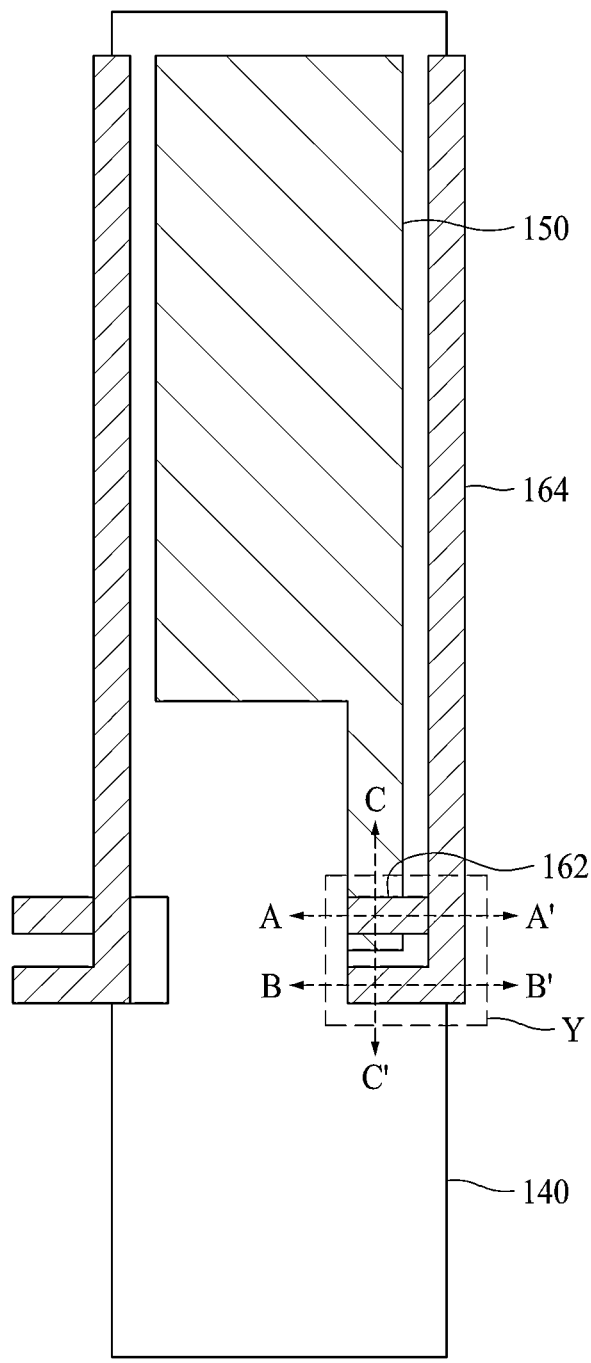
FIG. 16 is a plan view illustrating a pixel applied to a light emitting display apparatus according to an example embodiment of the present disclosure.
Figure 17:
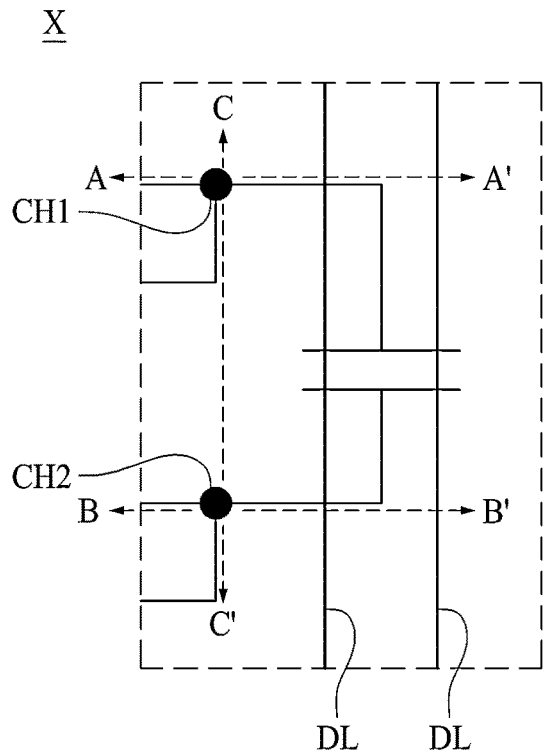
FIG. 17 is an exemplary view illustrating an area X shown in FIG. 5.
Figure 18:
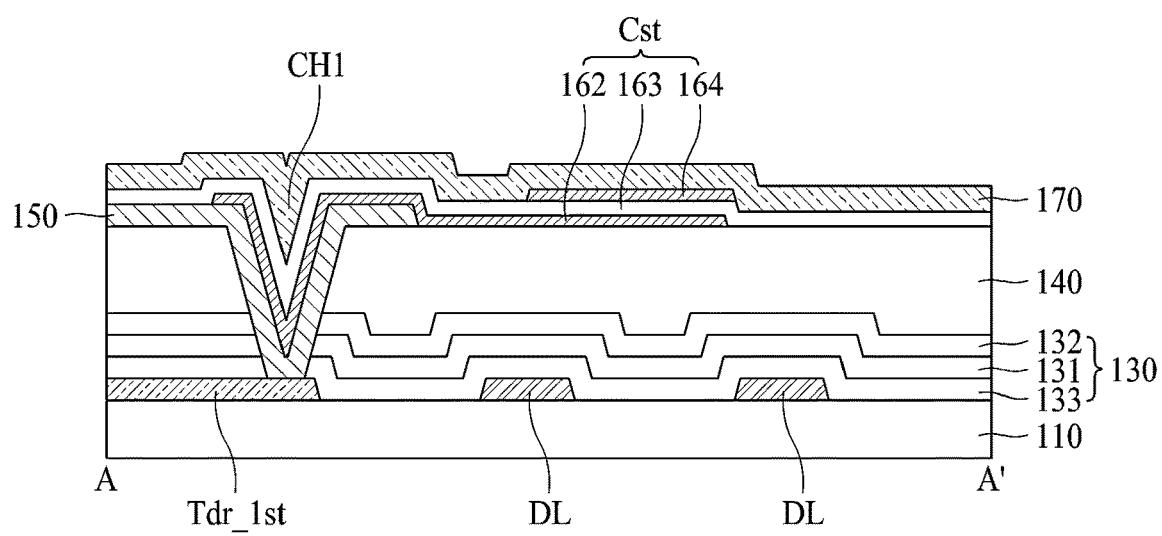
FIG. 18 is an exemplary view illustrating a cross-section taken along line A-A' shown in FIGS. 16 and 17.
Figure 19:
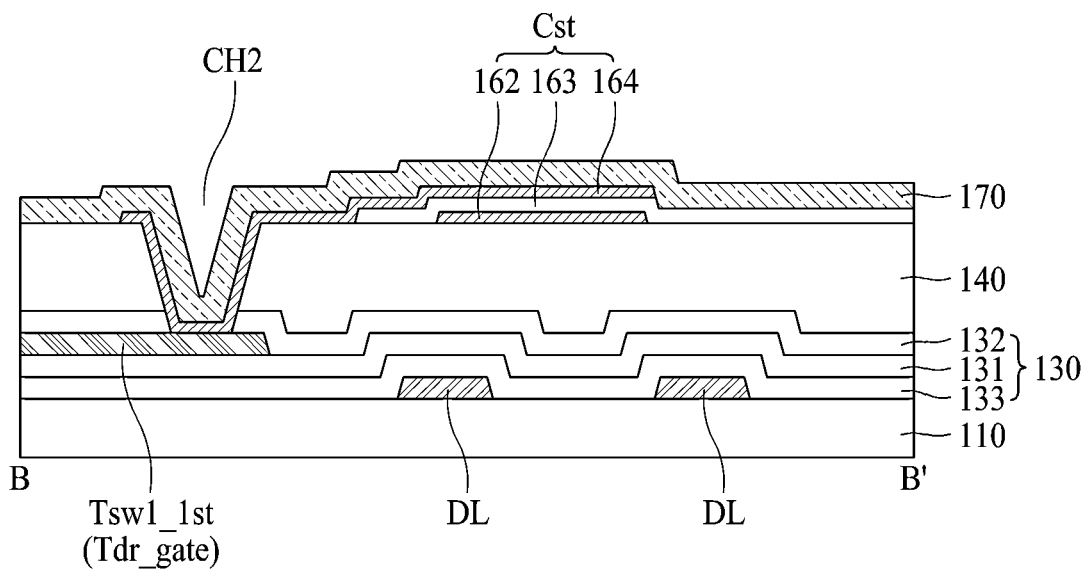
FIG. 19 is an exemplary view illustrating a cross-section taken along line B-B' shown in FIGS. 16 and 17.
Figure 20:
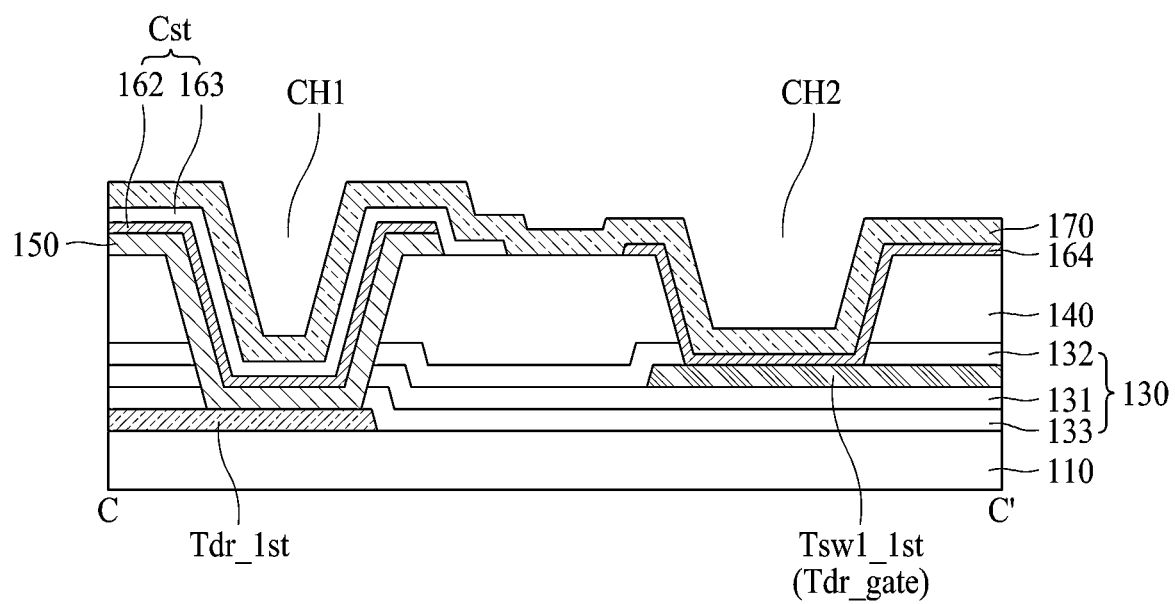
FIG. 20 is an exemplary view illustrating a cross-section taken along line C-C' shown in FIGS. 16 and 17.

FIGS. 9 to 15 are exemplary views illustrating a method of manufacturing a light emitting display apparatus according an example embodiment to the present disclosure. FIG. 16 is a plan view illustrating an example pixel in a light emitting display apparatus according to an example embodiment of the present disclosure. FIG. 17 is an exemplary view illustrating an area X shown in FIG. 5. FIG. 18 is an exemplary view illustrating a cross-section taken along line A-A' shown in FIGS. 16 and 17. FIG. 19 is an exemplary view illustrating a cross-section taken along line B-B' shown in FIGS. 16 and 17. FIG. 20 is an exemplary view illustrating a cross-section taken along line C-C' shown in FIGS. 16 and 17. In particular, FIG. 16 illustrates a plan view of an actual structure of an example pixel of a light emitting display panel manufactured with an example method illustrated in FIGS. 9 to 15. The area X shown in FIG. 17 may be an equivalent circuit of the area Y shown in FIG. 16.

A method of manufacturing a light emitting display apparatus according to an embodiment of the present disclosure will be described with reference to FIGS. 9 to 16.

Figure 9:
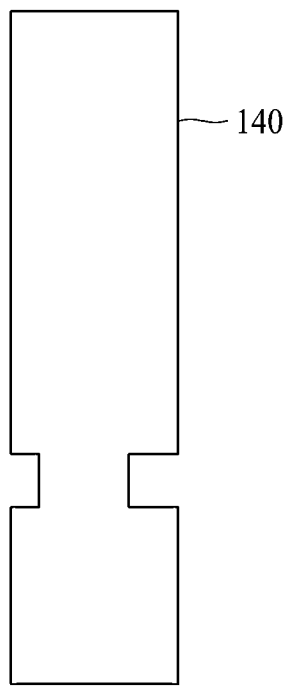
FIGS. 9 to 15 are exemplary views illustrating a method of manufacturing a light emitting display apparatus according to an example embodiment of the present disclosure.

A cover layer 140 provided in one pixel 101 may be patterned in an example shape shown in FIG. 9. As described above, a substrate 110 and a pixel driving layer 130 may be provided under the cover layer 140.

Figure 10:
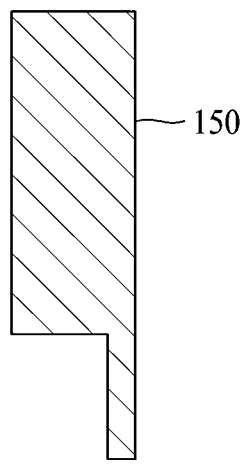
Figure 11:
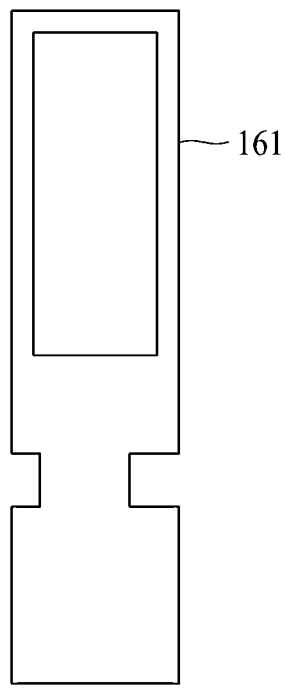

A first electrode 150 with an example shape shown in FIG. 10 may be provided on an upper surface of the cover layer 140.

A first insulating layer 161 may cover an outer portion of the first electrode 150 and the cover layer 140. To this end, the first insulating layer 161 may have an example shape shown in FIG. 11.

Figure 12:
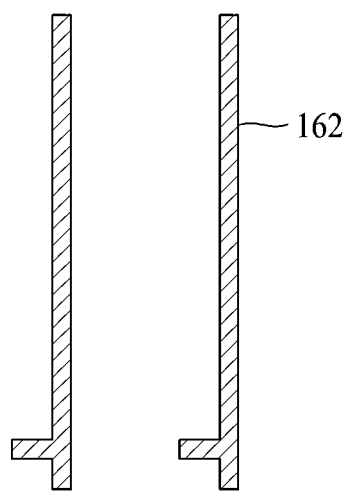

In an area corresponding to a first line among sides of the first electrode 150, a first metal layer 162 having an example shape shown in FIG. 12 may be provided.

Figure 13:
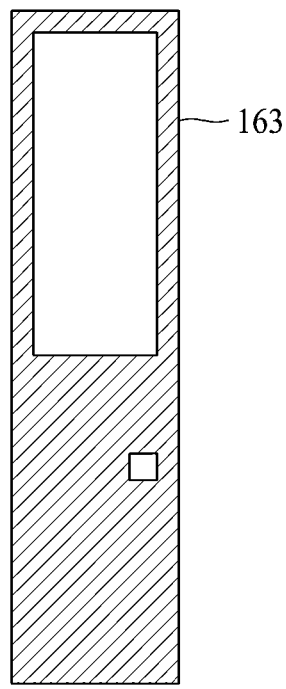

To cover the first metal layer 162, a second insulating layer 163 having an example shape shown in FIG. 13 may be provided on an upper surface of the first metal layer 162.

Figure 14:
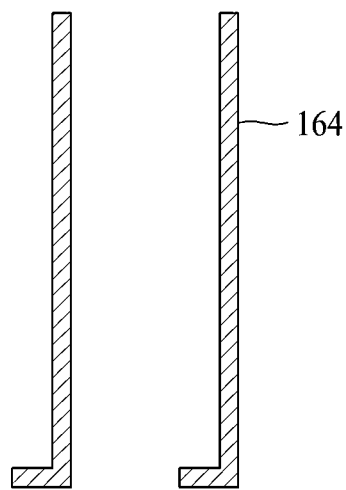

A second metal layer 164 having an example shape shown in FIG. 14 may be provided in an area of an upper surface of the second insulating layer 163 overlapping with the first metal layer 162.

Figure 15:
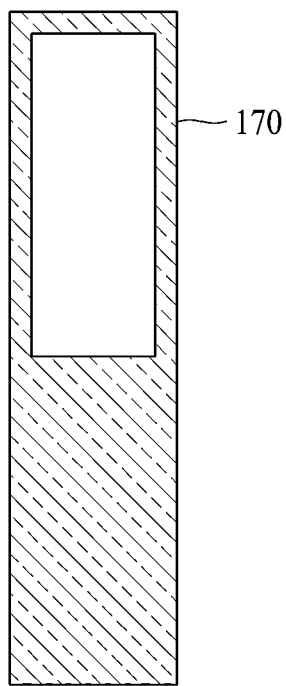

A bank 170 having an example shape shown in FIG. 15 may be provided on an upper surface of the second metal layer 164.

A cross-section of an example pixel manufactured through the above-described processes is shown in FIG. 16. That is, the first electrode 150, the first metal layer 162, the second metal layer 164, and the cover layer 140 of an example pixel 101 are shown in FIG. 16. The area represented by Y in FIG. 16 may correspond to the area X shown in FIG. 17. That is, the area X shown in FIG. 17 may be an equivalent circuit of the area Y shown in FIG. 16. Therefore, the line A-A', the line B-B', and the line C-C', which are shown in FIG. 17, may correspond to the line A-A', the line B-B', and the line C-C', which are shown in FIG. 16.

The line A-A' represents a cross-section (shown, e.g., in FIG. 18) illustrating, among others, the first metal layer 162 and a first contact hole CH1 through which the first metal layer 162 is connected to a first terminal Tdr_1st of the driving transistor Tdr and the first electrode 150.

The line B-B' represents a cross-section (shown, e.g., in FIG. 19) illustrating, among other things, the second metal layer 164 and a second contact hole CH2 through which the second metal layer 164 is connected to a gate Tdr_gate of the driving transistor Tdr and a first terminal Tsw1_1st of the switching transistor Tsw1.

The line C-C' represents a cross-section (shown, e.g., in FIG. 20) illustrating, among other things, the first contact hole CH1 and the second contact hole CH2.

That is, as described above, the first metal layer 162 of the capacitor Cst may be connected to the first terminal of the driving transistor Tdr and the first electrode 150, and the second metal layer 164 of the capacitor Cst may be connected to the gate of the driving transistor Tdr and the first terminal of the switching transistor Tsw1.

According to example embodiments of the present disclosure as described above, since the capacitor Cst may be provided between two anodes adjacent to each other with the first line as a boundary, parasitic capacitance generated between the capacitor Cst and the other electrodes may be reduced. In addition, since a capacitor Cst having a size corresponding to an area between two anodes may be provided, the capacitance required or desired for the light emitting display apparatus may sufficiently be obtained. Therefore, according to the present disclosure, a capacitor Cst having better performance than that of the related art may be provided.

According to the present disclosure, the following advantageous effects may be obtained. According to an example embodiment of the present disclosure, a capacitor may be provided below a bank occupying a large area in a light emitting display apparatus of high resolution, whereby an aperture ratio may be improved even in the light emitting display apparatus of high resolution.

In particular, since the capacitor may be provided in a layer or layers different from those of the transistors, an aperture ratio of the pixel may be improved in proportion the amount to space (in terms of distance or area) between the capacitor and the electrodes forming the transistors in a conventional light emitting display apparatus.

It will be apparent to those skilled in the art that the present disclosure is not limited by the above-described example embodiments and the accompanying drawings and that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents.

What is claimed is:

1. A light emitting display apparatus, comprising:
a substrate;
a pixel driving layer on the substrate and including a driving transistor;
a cover layer covering the pixel driving layer;
a plurality of light emitting elements, including a first light emitting element and a second light emitting element adjacent to each other and each having a first electrode on the cover layer;
a bank disposed on the cover layer and between the first electrode of the first light emitting element and the first electrode of the second light emitting element; and
a capacitor overlapping with the bank and disposed between the bank and the cover layer, the capacitor including:
a first metal layer connected with a first terminal of the driving transistor via the first electrode of one of the first and second light emitting elements, and
a second metal layer connected with a gate of the driving transistor.

2. The light emitting display apparatus of claim 1, wherein the capacitor further includes:
a first insulating layer on the cover layer and insulating the first electrode of the first light emitting element from the first electrode of the second light emitting element, the first insulating layer being under the first metal layer; and
a second insulating layer on the first metal layer and under the second metal layer,
wherein the bank is disposed on the second metal layer.

3. The light emitting display apparatus of claim 1, further comprising:
a light emitting layer on the bank and on the first electrode of at least one of the first and second light emitting elements; and
a second electrode on the light emitting layer.

4. The light emitting display apparatus of claim 1, wherein the bank covers the capacitor.

5. The light emitting display apparatus of claim 1, wherein the pixel driving layer includes a pixel driving unit having:
the driving transistor including the gate, the first terminal connected to the first electrode of one of the first and second light emitting elements, and a second terminal connected to a first voltage supply line;
a switching transistor including a gate connected to a gate line, a first terminal connected to the gate of the driving transistor, and a second terminal connected to a data line;
the capacitor; and
a sensing transistor including a first terminal connected to the first terminal of the driving transistor and to the first electrode of one of the first and second light emitting elements, a second terminal connected to a sensing line, and a gate connected to a sensing control line.

6. The light emitting display apparatus of claim 1, wherein the capacitor is disposed on a flat upper surface of the cover layer.

7. The light emitting display apparatus of claim 1, wherein the capacitor is disposed in a groove in the upper surface of the cover layer.

8. The light emitting display apparatus of claim 7, wherein each of the first and second light emitting elements further includes:
a light emitting layer on the first electrode; and
a second electrode on the light emitting layer,
wherein the first electrode of each of the first and second light emitting elements is adjacent to the groove and protrudes toward a center of the groove, and
wherein the light emitting layer and the second electrode of the first light emitting element are respectively separated from the light emitting layer and the second electrode of the second light emitting element at the groove.

9. The light emitting display apparatus of claim 1, wherein the capacitor extends along a boundary between the first electrode of the first light emitting element and the first electrode of the second light emitting element.

10. The light emitting display apparatus of claim 9, further comprising
a first line between the first electrode of the first light emitting element and the first electrode of the second light emitting element in a plan view and extending in a same direction as the capacitor,
wherein at least one of the first metal layer and the second metal layer of the capacitor overlaps with the first line in the plan view.

11. The light emitting display apparatus of claim 10, wherein the first line is one of a data line, a sensing line, and a first voltage supply line.

12. A light emitting display apparatus, comprising:
a substrate;
a pixel driving layer on the substrate and including a driving transistor;
a cover layer covering the pixel driving layer;
a plurality of light emitting elements, including a first light emitting element and a second light emitting element adjacent to each other and each having a first electrode on the cover layer;
a bank disposed on the cover layer and between the first electrode of the first light emitting element and the first electrode of the second light emitting element; and
a capacitor overlapping with the bank and extending along a boundary between the first electrode of the first light emitting element and the first electrode of the second light emitting element.

13. The light emitting display apparatus of claim 12, further comprising a first line between the first electrode of the first light emitting element and the first electrode of the second light emitting element in a plan view and extending in a same direction as the capacitor,
wherein at least one of the first metal layer and the second metal layer of the capacitor overlaps with the first line in the plan view.

14. The light emitting display apparatus of claim 13, wherein the first line is one of a data line, a sensing line, and a first voltage supply line.

15. The light emitting display apparatus of claim 12, wherein the capacitor includes:
a first insulating layer on the substrate;
a first metal layer on the first insulating layer;
a second insulating layer on the first metal layer; and a second metal layer of the second insulating layer,
wherein the cover layer is disposed the second metal layer.

16. The light emitting display apparatus of claim 15, wherein:
the capacitor is disposed in the pixel driving layer,
the first metal layer is connected with a first terminal of the driving transistor via the first electrode of one of the first and second light emitting elements, and
a second metal layer is connected with a gate of the driving transistor.

17. The light emitting display apparatus of claim 12, wherein the capacitor is disposed between the bank and the cover layer.

18. The light emitting display apparatus of claim 17, wherein the capacitor is disposed in a groove in the upper surface of the cover layer.

19. The light emitting display apparatus of claim 18, wherein each of the first and second light emitting elements further includes:
a light emitting layer on the first electrode; and
a second electrode on the light emitting layer,
wherein the first electrode of each of the first and second light emitting elements is adjacent to the groove and protrudes toward a center of the groove, and
wherein the light emitting layer and the second electrode of the first light emitting element are respectively separated from the light emitting layer and the second electrode of the second light emitting element at the groove.

* * * * *